(12) United States Patent
Jang et al.

(10) Patent No.: US 10,760,980 B2
(45) Date of Patent: Sep. 1, 2020

(54) IGBT TEMPERATURE SENSOR CORRECTION APPARATUS AND TEMPERATURE SENSING CORRECTION METHOD USING THE SAME

(71) Applicants: Hyundai Motor Company, Seoul (KR); Kia Motors Corporation, Seoul (KR)

(72) Inventors: Ji Woong Jang, Gyeonggi-do (KR); Kang Ho Jeong, Gyeongsangnam-do (KR); Ki Jong Lee, Gyeonggi-do (KR); Sang Cheol Shin, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 263 days.

(21) Appl. No.: 15/837,945

(22) Filed: Dec. 11, 2017

(65) Prior Publication Data

US 2018/0321094 A1    Nov. 8, 2018

(30) Foreign Application Priority Data

May 8, 2017    (KR) .................. 10-2017-0057344

(51) Int. Cl.

| | |
|---|---|
| *G01K 7/01* | (2006.01) |
| *G01K 15/00* | (2006.01) |
| *H01L 23/34* | (2006.01) |
| *H01L 27/16* | (2006.01) |
| *H01L 49/02* | (2006.01) |
| *H01L 35/32* | (2006.01) |
| *H01L 35/34* | (2006.01) |
| *H01L 29/739* | (2006.01) |
| *H01L 35/22* | (2006.01) |

(52) U.S. Cl.
CPC .......... *G01K 15/005* (2013.01); *G01K 7/015* (2013.01); *H01L 23/34* (2013.01); *H01L 27/16* (2013.01); *H01L 28/20* (2013.01); *H01L 35/32* (2013.01); *H01L 35/34* (2013.01); *H01L 29/7393* (2013.01); *H01L 35/22* (2013.01); *H01L 2924/13055* (2013.01)

(58) Field of Classification Search
CPC ... H01L 2924/13055; H01L 2924/1305; H01L 29/861; H01L 21/761; G01K 7/01; G01K 2217/00; G01K 15/00; G01K 7/00; G01K 7/16; G01K 15/005; G01R 17/00; G01R 27/08; G03G 15/5037; G01N 27/4065
USPC ........................ 374/178, 183, 185, 1; 702/99
See application file for complete search history.

(56) References Cited

U.S. PATENT DOCUMENTS

| | | | | |
|---|---|---|---|---|
| 4,472,262 A | * | 9/1984 | Kondo ............... | G01N 27/4065 204/408 |
| 4,730,228 A | * | 3/1988 | Einzinger .............. | G01K 3/005 361/103 |
| 5,719,778 A | * | 2/1998 | Suzumura .......... | G01N 27/4067 700/207 |

(Continued)

FOREIGN PATENT DOCUMENTS

CN    105928637 A    *    9/2016

*Primary Examiner* — Gail Kaplan Verbitsky
(74) *Attorney, Agent, or Firm* — Mintz Levin Cohn Ferris Glovsky and Popeo, P.C.; Peter F. Corless

(57) ABSTRACT

An Insulated Gate Bipolar Transistor (IGBT) temperature sensor correction apparatus includes an Insulated Gate Bipolar Transistor (IGBT); a temperature sensor having a sensing diode; and a process variation sensor having an internal resistor.

14 Claims, 9 Drawing Sheets

(56) References Cited

U.S. PATENT DOCUMENTS

| | | | | |
|---|---|---|---|---|
| 6,486,452 B2* | 11/2002 | Loyd, Sr. | ............... | A61F 7/007 219/212 |
| 6,831,449 B2* | 12/2004 | Nishida | ............... | H02M 3/156 323/222 |
| 6,955,164 B2* | 10/2005 | Kesler | ............... | F02P 3/055 123/630 |
| 7,279,954 B2* | 10/2007 | Throngnumchai | ...... | G01K 7/01 327/138 |
| 7,507,023 B2* | 3/2009 | Oyabe | ............... | G01K 7/015 327/512 |
| 8,033,721 B2* | 10/2011 | Ooe | ............... | G01K 7/01 327/513 |
| 9,689,754 B2* | 6/2017 | Thogersen | ............... | G01K 7/01 |
| 9,927,483 B2* | 3/2018 | Bohllander | ......... | G01R 31/2603 |
| 10,416,233 B2* | 9/2019 | Kuo | ............... | G01R 31/2856 |
| 10,462,861 B2* | 10/2019 | Wang | ............... | H05B 45/37 |
| 2002/0047007 A1* | 4/2002 | Loyd, Sr. | ............... | A61F 7/007 219/530 |
| 2004/0047396 A1* | 3/2004 | Nomura | ............... | F02D 41/1476 374/141 |
| 2005/0046463 A1* | 3/2005 | Throngnumchai | ...... | G01K 7/01 327/524 |
| 2005/0178372 A1* | 8/2005 | Kesler | ............... | F02P 3/055 123/630 |
| 2009/0206821 A1* | 8/2009 | Meterelliyoz | ........... | H01L 22/34 324/76.11 |
| 2011/0120989 A1* | 5/2011 | Schilling | ............... | H05B 6/062 219/661 |
| 2015/0117492 A1* | 4/2015 | Takihara | ............... | H02M 1/32 374/152 |
| 2016/0011058 A1* | 1/2016 | Kiep | ............... | G01K 7/01 374/178 |
| 2016/0116345 A1* | 4/2016 | Furtner | ............... | G01K 7/01 374/178 |
| 2016/0371485 A1* | 12/2016 | Onabajo | ............... | H01L 23/00 |
| 2018/0003574 A1* | 1/2018 | Jang | ............... | G01K 15/005 |
| 2018/0210029 A1* | 7/2018 | Kuo | ............... | G06F 11/27 |

* cited by examiner

FIG. 7A

| process variation | Resistor pattern | | Diode pattern | |
|---|---|---|---|---|
| | Pattern shape | Resistance value (corrected IF value) | Pattern shape | Voltage value Offset voltage |
| First embodiment (normal) | | Normal value (normal) | | Normal value |
| Second embodiment (Increase of Pattern Width) | | Reduction (Increased IF) | | Reduction (offset reduction) |
| Third embodiment (Reduction of Patten Width) | | Increase (IF reduction) | | Reduction (Increased offset) |

FIG. 7B

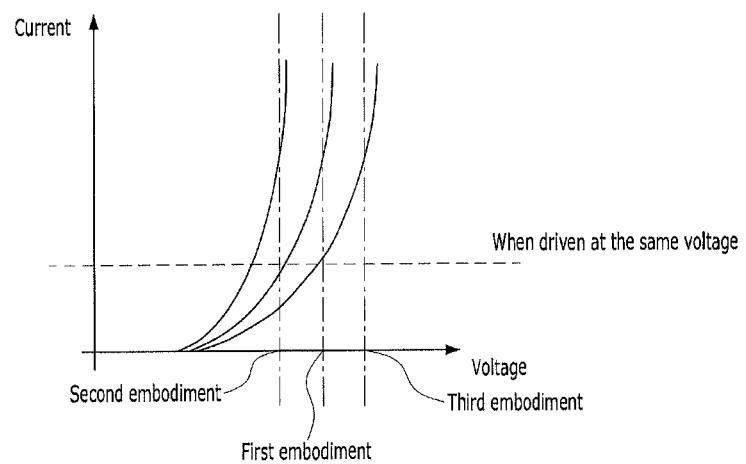

IGBT TEMPERATURE SENSOR CORRECTION APPARATUS AND TEMPERATURE SENSING CORRECTION METHOD USING THE SAME

CROSS-REFERENCE TO RELATED APPLICATION

This application claims the benefit of Korean Patent Application No. 10-2017-0057344, filed on May 8, 2017, which is hereby incorporated by reference in its entirety as if fully set forth herein.

BACKGROUND OF THE DISCLOSURE

Technical Field

The present disclosure relates to an Insulated Gate Bipolar Transistor (IGBT) temperature sensor correction apparatus and a temperature sensing correction method using the same, and more particularly to an IGBT temperature sensor correction apparatus including a correction circuit capable of minimizing errors caused by semiconductor characteristics based on temperature, and a temperature sensing correction method using the same.

Discussion of the Related Art

A conventional temperature sensor may be implemented as a negative temperature coefficient (NTC)-type temperature sensor arranged on a Direct Bonded Copper (DBC) of an IGBT module. A DBC temperature may be almost identical to a temperature of a cooler standing against the DBC bottom. The conventional temperature sensor has to measure a junction temperature of a semiconductor chip to be actually heated, such that a coolant temperature is monitored, resulting in occurrence of unexpected errors.

Therefore, an improved scheme for directly detecting an IGBT junction temperature has recently been developed, which integrates a polysilicon diode onto an IGBT chip and thus directly detects an IGBT temperature using voltage-temperature characteristics of the polysilicon diode. However, a semiconductor process variation (i.e., a deviation in semiconductor fabrication) of the IGBT chip can frequently occur, such that the improved scheme has difficulty in estimating the correct temperature, and unexpected errors occur in each sample.

As a result, a deviation of a temperature sensing value for each phase of a three-phase inverter may occur, and a deviation for each product may also occur. Accordingly, a maximum current of the temperature sensor should be restricted in accordance with the IGBT thermal model and the temperature sensing deviation, and the maximum output of motors of electric vehicles and hybrid vehicles should be similarly limited. In addition, assuming that temperature estimation at end of life (EOL) is performed incorrectly, the driver's safety may be put at risk due to thermal destruction of a power module.

FIG. 1 is a view illustrating ON-voltage characteristics based on a conventional diode junction temperature (Tj). As shown in FIG. 1, an ON-voltage (hereinafter referred to as V_F) of a diode temperature sensor (hereinafter referred to as a temperature sensor) embedded in the IGBT may be inversely proportional to the IGBT junction temperature (Tj) of the diode temperature sensor (hereinafter referred to as a temperature sensor) embedded in the IGBT. Therefore, the ON-voltage (V_F) is monitored according to change in temperature, such that the temperature (T_j) of the IGBT can be estimated.

FIG. 2 is a circuit diagram illustrating a conventional temperature sensing protection circuit.

As shown in FIG. 2, a temperature sensing protection circuit 200 may include a microprocessor 210, a comparator 220, a constant current source 230, a temperature sensing diode 240, an IGBT 250, and a DC power source 260. The temperature sensing diode 240 may be a sensing element for sensing or detecting a temperature of an IGBT 250, and the IGBT 250 may include a single diode or at least two diodes connected in series, such that the temperature sensing protection circuit 200 may be configured in a manner that a current may flow from the constant current source to the diode acting as the temperature sensor.

In the above-mentioned temperature sensing protection circuit, the temperature sensing diode 240 may be integrated with a heating part (e.g., a specific position located close to the semiconductor chip) included in the IGBT 250 in such a manner that the temperature sensing diode 240 can be used as a sensing element for detecting the IGBT temperature. A power source and a resistor may be connected to an input terminal of the diode such that a predetermined current can flow in the input terminal of the diode.

The temperature sensing diode 240 may be turned on by the constant current source 230 embedded in the above-mentioned circuit, such that a value of the voltage (V_F) may be decided. In this case, a voltage value based on temperature may be applied to a positive (+) input terminal of the comparator 220. A DC input value may be applied to a negative (−) input terminal of the comparator 220, and the DC voltage value may be calculated and decided by an overheating protection level of the IGBT.

Referring once again to FIG. 1, it is assumed that the DC voltage may be set to about 2.2 V. If the temperature (Tj) corresponds to room temperature, the value of the voltage (V_F) is about 2.7 V, such that the V_F value is higher than the overheating protection level. As a result, a temperature (FLT_TEMP) is output at a high level (HIGH). As the temperature (Tj) gradually increases to 150° C., the voltage (V_F) is about 2.2 V. If the V_F voltage is lower than the DC voltage, the temperature (FLT_TEMP) is output as a low level (LOW).

The above-mentioned FLT_TEMP signal may be monitored by the microprocessor 210 so that the output current is limited or the IGBT is turned off, resulting in protection against thermal destruction of the power module.

FIGS. 3A and 3B include views illustrating a conventional temperature sensor.

FIG. 3A shows a layout structure of the IGBT including the temperature sensor 310 therein. In this case, TEMP(+) may denote a cathode of the diode, and TEMP(−) may denote an anode of the diode.

FIG. 3B is a cross-sectional view illustrating one region of the temperature sensor. As shown in FIG. 3B, the temperature sensor 310 may include a silicon 321, a passivation film 322, a polysilicon 323, a TEMP(+) metal 325, a TEMP(−) metal 325, and a protection layer 326.

In order to form the above-mentioned constituent elements, the following semiconductor fabrication processes are needed. The passivation film 322 may be deposited over a specific part in which the temperature sensor 310 is to be formed. As a result, a high-current path of the IGBT is formed, resulting in prevention of diode damage.

The polysilicon 323 may be deposited over the passivation film 322. A pattern of the temperature sensor 310 may be formed through a photo process (i.e., a photolithography process). The cathode region may be doped with a P+ dopant, and the anode region may be doped with an N+ dopant, resulting in formation of a diode structure.

In this case, significant errors may occur in the photo process of the above-mentioned semiconductor fabrication process. As a result, due to semiconductor process variation (i.e., a deviation in semiconductor fabrication) encountered when the polysilicon layer is formed, a high sensing voltage of the above-mentioned temperature sensor for each sample may occur.

SUMMARY OF THE DISCLOSURE

Accordingly, the present disclosure is directed to an IGBT temperature sensor correction apparatus and a temperature sensing correction method using the same that substantially obviate one or more problems due to limitations and disadvantages of the related art.

An object of the present disclosure is to provide an IGBT temperature sensor correction apparatus for correcting a temperature sensing voltage by adjusting a diode current according to the process variation.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

In accordance with embodiments of the present disclosure, an Insulated Gate Bipolar Transistor (IGBT) temperature sensor correction apparatus includes: an Insulated Gate Bipolar Transistor (IGBT); a temperature sensor having a sensing diode; and a process variation sensor having an internal resistor.

Furthermore, in accordance with embodiments of the present disclosure, a temperature sensing correction method using the Insulated Gate Bipolar Transistor (IGBT) temperature sensor includes: changing, by a driver integrated circuit (IC), a value of a current allocated to a temperature sensor according to a resistance value of an internal resistor of a process variation sensor; correcting a voltage value in response to the changed current value allocated to the temperature sensor; and sensing, by the temperature sensor, the corrected voltage.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 7A to 7C are conceptual diagrams illustrating correlation between the process variation sensor and the temperature sensor according to embodiments of the present disclosure.

Figure 1:
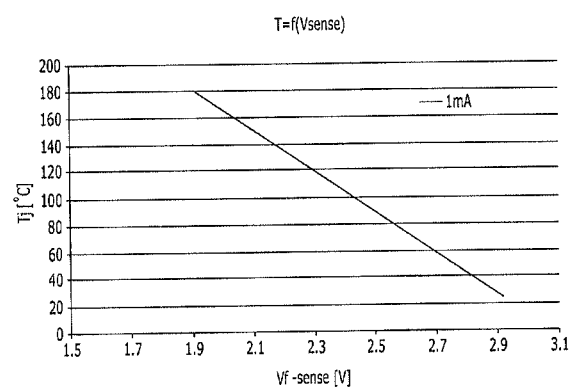
FIGS. 1 to 3B include views illustrating a conventional temperature sensor.
Figure 2:
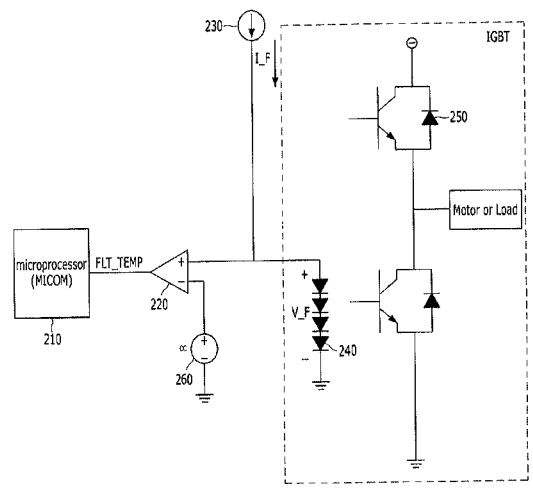
Figure 3A:
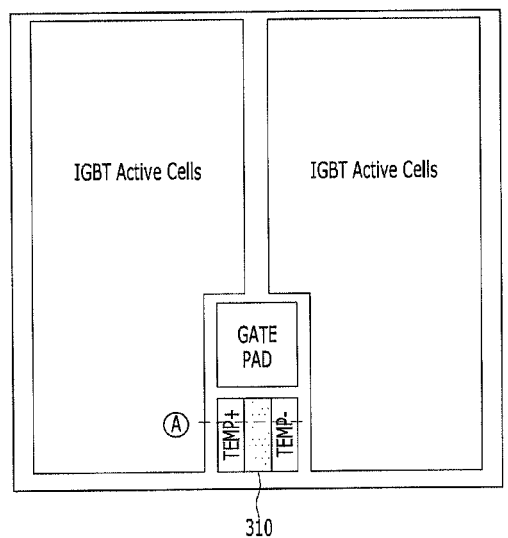
Figure 3B:
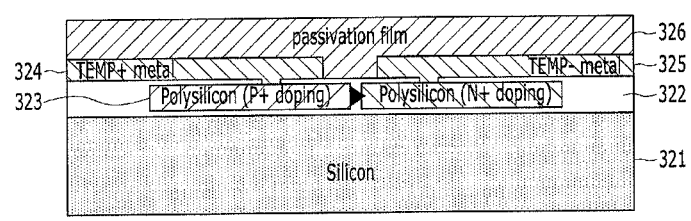

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, an apparatus and method according to embodiments of the present disclosure will be described with reference to the accompanying drawings. In the following description, suffixes "module" and "unit" contained in terms of constituent elements to be described will be selected or used together in consideration only of the convenience of writing the following specification, and the suffixes "module" and "unit" do not necessarily have different meanings or roles.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that, although the terms first, second, A, B, (a), (b), etc. may be used herein to describe various elements of the present disclosure, these terms are only used to distinguish one element from another element and essential, order, or sequence of corresponding elements are not limited by these terms. It will be understood that when one element is referred to as being "connected to", "coupled to", or "accessed by" another element, one element may be "connected to", "coupled to", or "accessed by" another element via a further element although one element may be directly connected to or directly accessed by another element.

The term "comprises", "includes", or "has" described herein should be interpreted not to exclude other elements but to further include such other elements since the corresponding elements may be inherent unless mentioned otherwise. All terms including technical or scientific terms have the same meanings as generally understood by a person having ordinary skill in the art to which the present disclosure pertains unless mentioned otherwise. Generally used terms, such as terms defined in a dictionary, should be interpreted to coincide with meanings of the related art from the context. Unless obviously defined in the present disclosure, such terms are not to be interpreted as having ideal or excessively formal meanings.

The embodiments of the present disclosure relate to an IGBT temperature sensor correction apparatus including a correction circuit capable of minimizing errors caused by semiconductor characteristics based on temperature, and a temperature sensing correction method using the same, such that the IGBT temperature sensor correction apparatus and the temperature sensing correction method using the same can more precisely sense the temperature and can mitigate the maximum output margin of the IGBT.

Figure 4:
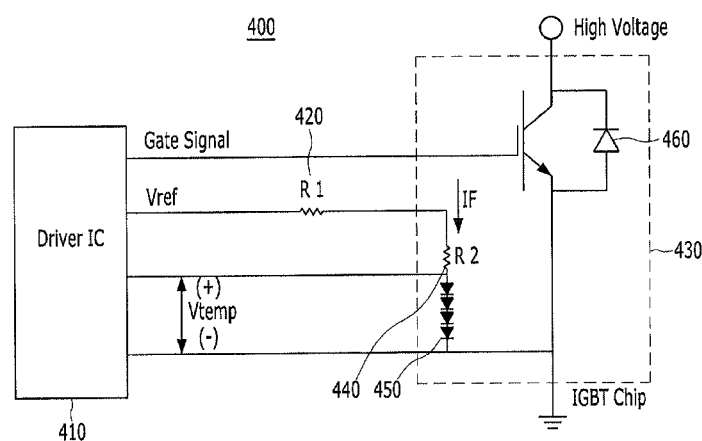
FIG. 4 is a circuit diagram illustrating an IGBT temperature sensor correction apparatus according to embodiments of the present disclosure.

FIG. 4 is a circuit diagram illustrating an IGBT temperature sensor correction apparatus according to embodiments of the present disclosure.

As shown in FIG. 4, the IGBT temperature sensor correction apparatus 400 may include a driver integrated circuit (IC) 410, an external resistor 420, and an IGBT chip 430.

The driver ID 410 may output a constant voltage source (Vref) needed to drive a temperature sensor.

The driver IC 410 may correspond to a resistance value of the external resistor 420, and may adjust the value of a current allocated to the temperature sensor.

The driver IC 410 may correct the sensing voltage of the temperature sensor in response to resistance of the external resistor 420.

The driver IC 410 may convert a diode voltage (Vtemp) into temperature information. The driver IC 410 may perform conversion of the temperature information, and may apply the conversion result to a protection function or the like.

The external resistor 420 may be arranged between the driver IC 410 and the IGBT chip 430.

The external resistor 420 may have an external resistance value needed to decide the value of an operating current of the IGBT temperature sensor correction apparatus 400. The resistance value of the external resistor 420 may be selected at random by user selection. If the resistance value of the external resistor 420 is optimized, the diode current value may be adjusted according to the process variation.

Through adjustment of the resistance value of the external resistor 420, the voltage value of the temperature sensor may be corrected.

The IGBT chip 430 may include an internal resistor 440 and a sensing diode 450. The IGBT chip 430 may sense and detect the process variation.

The internal resistor 440 may be located at the IGBT chip, and may be arranged between the external resistor and the temperature sensor.

The internal resistor 440 may be decided by the process variation designed in the IGBT chip 430.

The above process variation may include a resistance value indicating a variation (or deviation) encountered in a photolithography process, an etching process, etc.

For example, if a normal resistance design value of the internal resistor 440 is denoted by R', the internal resistor 440 may have R'±ΔR according to the process variation thereof, where ΔR may be a resistance value that is changed according to the process variation.

The sensing diode 450 may be located at the IGBT chip 430, and may be connected in series to the internal resistor 440. The sensing diode 450 may include a plurality of diodes.

A current may flow in the sensing diode 450. The current (IF) may be represented by the following equation 1 in consideration of the external resistor 420 and the internal resistor 440 because of Ohm's law (V=IR).

$$IF = (Vref - Vtemp)/(\text{External Resistor} + \text{Internal Resistor}) \quad \text{[Equation 1]}$$

In Equation 1, Vref may denote an internal drive voltage, Vtemp may denote a voltage between both ends of the diode, the External Resistor may denote an external resistance value needed to decide the operating current value, and the Internal Resistor may denote a resistance value indicating the process variation.

In addition, the current (IF) may be represented by the following equation 2 according to the Shockley diode equation.

$$IF = Is[e^{\wedge}(Vtemp/VT) - 1] \quad \text{[Equation 2]}$$

In Equation 2, Is may denote a saturation current, and each of Vtemp, VT+kT/q, and Is, k, q may be a constant value (i.e., an invariant number).

Figure 5A:
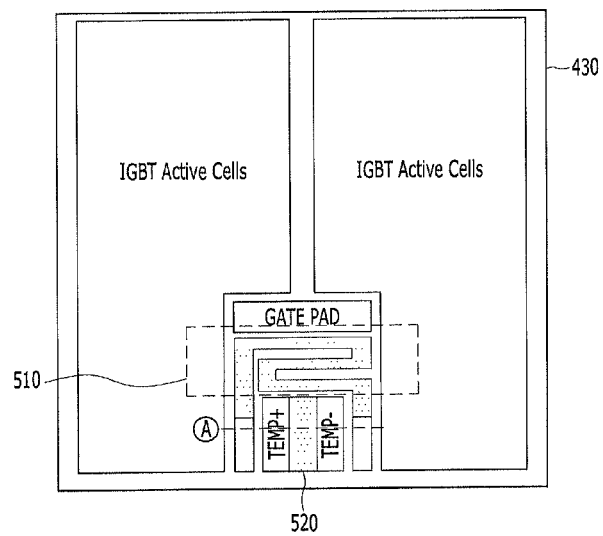
FIGS. 5A and 5B are conceptual diagrams illustrating the IGBT chip according to embodiments of the present disclosure.
Figure 5B:
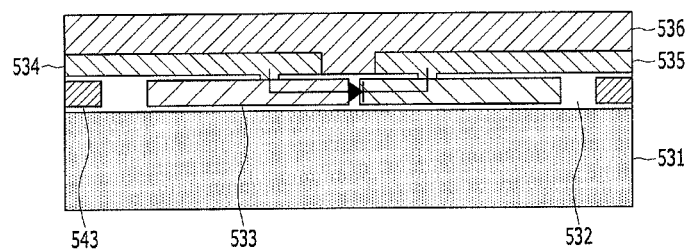

FIGS. 5A and 5B are conceptual diagrams illustrating the IGBT chip according to embodiments of the present disclosure.

FIG. 5A is a layout diagram of the IGBT chip.

As shown in FIG. 5A, the IGBT chip 430 may include a process variation sensor 510 and a temperature sensor 520.

The process variation sensor 510 may include the internal resistor 440. That is, 'ㄹ'-shaped line of the process variation sensor may be a resistor line formed of low-doped silicon.

The patterns of the process variation sensor 510 may be changed to other patterns as necessary, without being limited thereto.

The resistor contained in the above process variation sensor may be formed by the photolithography process (hereinafter referred to as the "photo process") using the same mask as in the above diode temperature sensor layer.

The process variation sensor 510 may detect the degree of deviation encountered in the photo process when tolerance occurs in the photo process for forming the temperature sensor.

The temperature sensor 520 may be connected to the process variation sensor 510, and may be formed at the center of the lower end of the IGBT chip. The temperature sensor 520 may include the sensing diode 450.

FIG. 5B is a vertical cross-sectional view illustrating the temperature sensor and the process variation sensor 510.

The temperature sensor 520 may include a silicon layer 531, a passivation film 532, a polysilicon layer 533, a TEMP(+) metal 534, a TEMP(−) metal 535, and a protection layer 536.

The passivation film 532 may be formed at the part in which the temperature sensor 520 is to be formed. The polysilicon layer may be formed over the passivation film 532. The polysilicon may be formed to have a pattern of the temperature sensor 520 and the process variation sensor 510 through the photo process.

Thereafter, the polysilicon layer 533 may allow the cathode region to be doped with P+ dopant. The polysilicon layer 533 may allow the anode region to be doped with N+ dopant. The polysilicon layer 533 may construct the diode structure through such doping.

The TEMP(+) metal 534 may be a cathode of the diode, and the TEMP(−) metal 535 may be an anode of the diode.

The process variation sensor 510 may be formed of low-doped material (P- or N-) instead of a high-doped material. The process variation sensor 510 may have a pattern similar to the resistor pattern. Accordingly, the process variation sensor 510 may include a resistor line formed of a low-doped silicon material 543.

The process variation sensor 510 may include: 1) a first horizontal resistor line that is spaced apart from a gate pad by a predetermined distance and arranged in a horizontal direction; 2) a first vertical resistor line arranged perpendicular to one end of the first horizontal resistor line; 3) a second horizontal resistor line that is arranged horizontal to one end of the first vertical resistor line and spaced apart from the first horizontal line by a predetermined distance; 4) a second vertical resistor line that is arranged perpendicular to one end of the second horizontal resistor line and spaced apart from the first vertical resistor line by a predetermined distance; and 5) a third horizontal resistor line that is arranged horizontal to one end of the second vertical resistor line and spaced apart from the second horizontal line by a predetermined distance.

The process variation sensor 510 may be formed by the same photo process as in the temperature sensor 520. Therefore, the resistance value of the process variation sensor 510 may represent the degree of the process variation caused by the temperature sensor 520. Accordingly, a value of the resistor line indicates the degree of process variation of the temperature sensor 520.

Figure 6:
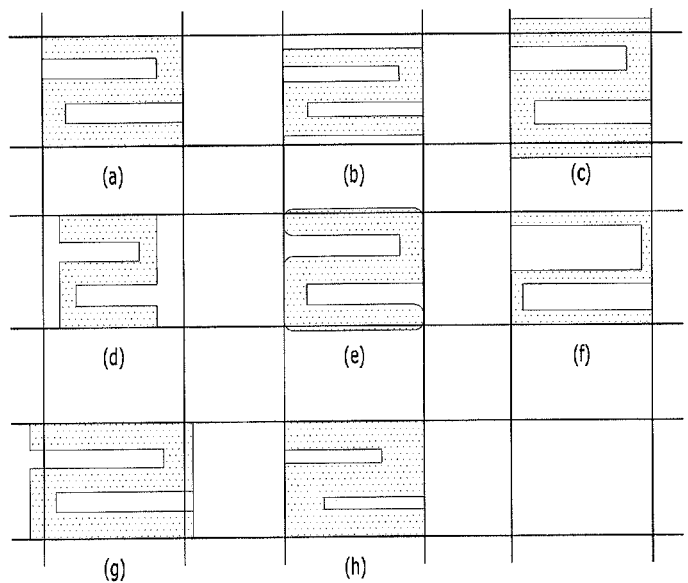
FIG. 6 is a conceptual diagram illustrating patterns of the process variation sensor according to embodiments of the present disclosure.

FIG. 6 is a conceptual diagram illustrating patterns of the process variation sensor according to embodiments of the present disclosure.

As shown in FIG. 6, the process variation sensor 510 may have a variety of deviations encountered by the photo process as necessary. Due to occurrence of such deviations, a total length and a total width of the process variation sensor 510 may be changed in various ways. Therefore, the resistance value may also be changed in response to the total length and total width of the process variation sensor 510.

Section (a) of FIG. 6 illustrates an exemplary case in which the process variation sensor 510 is formed to have a predetermined pattern. In this case, the resistance value of the process variation sensor 510 may have a predetermined resistance value. The predetermined resistance value may denote a normal state (or a steady state).

As can be seen from section (b) of FIG. 6, assuming that the resistance pattern of the process variation sensor 510 is reduced in a vertical direction as compared to the above normal state, the resistance value of the temperature sensor 520 may increase, the current value allocated to the temperature sensor 520 may be reduced, and the voltage value allocated to the temperature sensor 520 may increase.

As can be seen from section (c) of FIG. 6, assuming that the resistance pattern of the process variation sensor 510 is extended in a vertical direction as compared to the normal state, the resistance value of the temperature sensor 520 may be reduced, the current value allocated to the temperature sensor 520 may increase, and the voltage value allocated to the temperature sensor 520 may be reduced.

As can be seen from section (d) of FIG. 6, assuming that the resistance pattern of the process variation sensor 510 is reduced in a horizontal direction as compared to the normal state, the resistance value of the temperature sensor 520 may be reduced, the current value allocated to the temperature sensor 520 may increase, and the voltage value allocated to the temperature sensor 520 may be reduced.

As can be seen from section (e) of FIG. 6, the pattern of the process variation sensor 510 may be different from that of the process variation sensor 510 of section (a) of FIG. 6 as compared to the normal state.

If the resistance value increases in response to the above pattern, the resistance value of the temperature sensor 520 may increase, the current value allocated to the temperature sensor 520 may be reduced, and the voltage value allocated to the temperature sensor 520 may increase.

If the resistance value is reduced in response to the above pattern, the resistance value of the temperature sensor 520 may be reduced, the current value allocated to the temperature sensor 520 may increase, and the voltage value allocated to the temperature sensor 520 may be reduced.

As can be seen from section (f) of FIG. 6, assuming that the width of the process variation sensor 510 is reduced in width as compared to the normal state, the resistance value may increase, the resistance value of the temperature sensor may increase, the current value allocated to the temperature sensor 520 may be reduced, and the voltage value allocated to the temperature sensor 520 may increase.

As can be seen from section (g) of FIG. 6, assuming that the width of the process variation sensor 510 is extended in a horizontal direction as compared to the normal state, the resistance value may increase, the resistance value of the temperature sensor 520 may increase, the current value allocated to the temperature sensor 520 may be reduced, and the voltage value allocated to the temperature sensor 520 may increase.

As can be seen from section (h) of FIG. 6, assuming that the width of the process variation sensor 510 is extended as compared to the normal state, the resistance value may be reduced, the resistance value of the temperature sensor 520 may be reduced, the current value allocated to the temperature sensor 520 may increase, and the voltage value allocated to the temperature sensor 520 may be reduced.

Figure 7C:
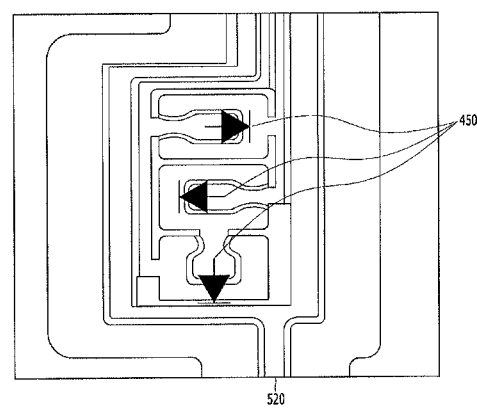

FIGS. 7A to 7C include conceptual diagrams illustrating correlation between the process variation sensor and the temperature sensor according to embodiments of the present disclosure.

FIG. 7A illustrates patterns of the process variation sensor and patterns of the temperature sensor according to embodiments of the present disclosure.

As shown in FIG. 7A, assuming that the pattern of the process variation sensor 510 according to a first example is normal, the process variation sensor 510 may have a predetermined resistance value. If the above resistor is normal, the current value allocated to this resistor may be set to a predetermined current value. The voltage value allocated to the temperature sensor 520 may be set to a predetermined voltage value.

A second example of the present disclosure discloses that the pattern of the process variation sensor 520 may have a width larger than that of the normal pattern. The resistance value of the process variation sensor 510 according to the second example may be higher than that of the normal case. If the pattern of the resistor pattern is increased in width, the diode may also be increased in width. If the width of the diode increases, the sensing voltage value of the diode may be reduced. This means that an offset may be lower than that of the diode having a normal state.

A third example of the present disclosure discloses that the pattern of the process variation sensor 510 may have a smaller width than that of the normal pattern. The resistance value of the process variation sensor 510 according to the third example may be lower than that of the normal case. If the pattern of the resistor pattern is reduced in width, the diode may also be reduced in width. If the width of the diode is reduced, the sensing voltage value of the diode may increase. This means that an offset may be higher than that of the diode having a normal state.

FIG. 7B illustrates diode characteristics according to the embodiment of FIG. 7A.

As shown in FIG. 7B, due to occurrence of the process variation, the temperature sensor may have different resistance values. As a result, the first example, the second example, and the third example may have different voltage values when driven at the same current.

If the resistance value caused by the process variation increases, the sensing voltage value of the temperature sensor 520 may also increase. If the resistance value caused by the process variation is reduced, the sensing voltage value of the temperature sensor 520 may also be reduced.

Therefore, a voltage of the temperature sensor 420 may be proportional to the resistance value of the process variation. Through the relationship between the resistance value of the process variation sensor 510 and the voltage value of the temperature sensor 520, a voltage offset value caused by the process variation may be adjusted.

FIG. 7C illustrates a layout diagram of the temperature sensor according to embodiments of the present disclosure.

As shown in FIG. 7C, the temperature sensor may include 3 to 4 diodes connected in series to each other in consideration of the sensing resolution. The above diode may have a voltage of about 0.8 V at room temperature. Therefore, the temperature sensor may have a voltage range of 2.4 V to 3.2V.

Figure 8:
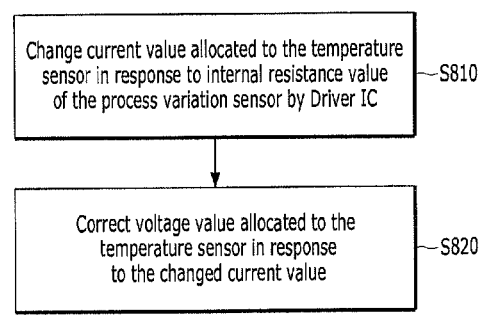
FIG. 8 is an additional flowchart illustrating a method for controlling an IGBT temperature sensor correction apparatus according to embodiments of the present disclosure.

FIG. 8 is an additional flowchart illustrating a method for controlling an IGBT temperature sensor correction apparatus according to embodiments of the present disclosure.

As shown in FIG. 8, the IGBT temperature sensor correction method may include a first step S810 in which the driver IC changes a current value allocated to the temperature sensor in response to a resistance value of the internal resistor of the process variation sensor; and a second step S820 in which the driver IC corrects a voltage value allocated to the temperature sensor according to the changed current value.

For example, the process variation sensor 520 of the IGBT temperature sensor circuit 500 in a non-correction offset state may sense and detect the process variation caused by the increased pattern width.

If the process variation occurs, the diode width of the temperature sensor 520 may increase. If the diode width increases, the resistance value of the diode may be reduced. If the diode resistance is reduced, the sensing voltage of the diode may be reduced, resulting in implementation of a negative(−) offset state. If the negative(−) offset state is achieved, the temperature sensor 520 may detect a temperature of the current state at a higher temperature than the actual temperature.

For example, the process variation sensor 520 of the IGBT temperature sensor circuit 500 in a correction offset state according to the second embodiment may sense and detect the process variation caused by the increasing pattern width. If the process variation occurs, the diode width of the temperature sensor 520 may increase.

If the diode width increases, the resistance value of the diode may be reduced. If the resistance value of the diode is reduced, the sensing voltage of the diode may be reduced, resulting in implementation of the negative(−) offset state.

If fixed variation (or deviation) occurs, the pattern width of the internal resistor of the process variation sensor may increase. If the pattern width of the internal resistor increases, the internal resistance value may be reduced.

If the internal resistance value is reduced, the current flowing in the internal resistor may increase. If the current increases, the diode sensing voltage increases such that the offset voltage may be corrected to a positive(+) voltage value.

Figure 9:
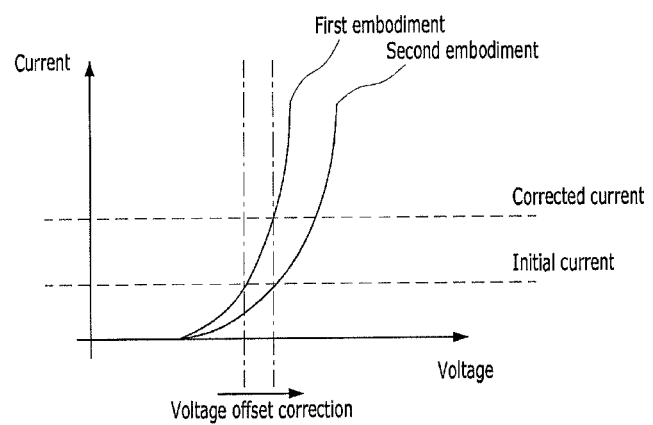
FIG. 9 is a view illustrating characteristics caused by voltage offset correction according to embodiments of the present disclosure.

FIG. 9 is a view illustrating characteristics caused by voltage offset correction according to embodiments of the present disclosure.

As shown in FIG. 9, the voltage offset according to embodiments of the present disclosure may have a negative (−) offset state in response to the initial current value, as compared to the first embodiment. If the current value is increased to a corrected current value so as to correct the negative(−) offset state, the diode current may increase by the voltage offset correction of the second embodiment, and the voltage may also increase in response to the increasing current.

FIGS. 10A to 10D are views illustrating a method for sensing a temperature for each sample according to embodiments of the present disclosure.

Figure 10A:
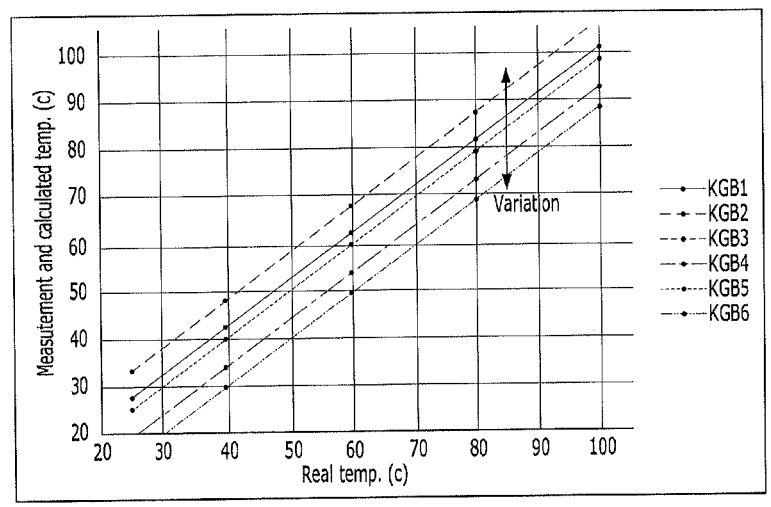
FIGS. 10A to 10D are views illustrating a method for sensing a temperature for each sample according to embodiments of the present disclosure.

As can be seen from FIG. 10A, prior to application of the correction circuit, there may occur a high variation (or high deviation) among a plurality of samples IGBT1 to IGBT6 as shown in the graph including the temperature sensing values and the actual values.

For example, if the actual temperature is set to 40° C., the IGBT2 may sense and detect the sensing temperature value of about 48° C. If the actual temperature is set to 40° C., the IGBT2 may sense and detect the sensing temperature value at about 30° C. As described above, if a high variation (or high deviation) among the respective samples occurs, and if a motor drive operating region includes a margin, the motor drive operating region may be considerably reduced in size.

Figure 10B:
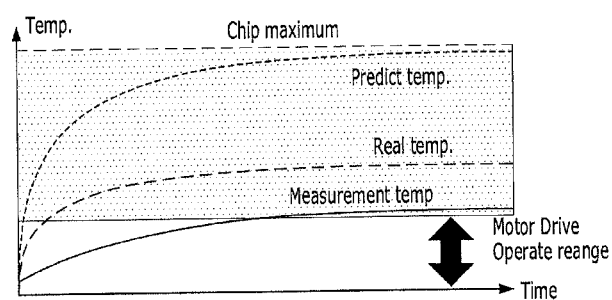
Figure 10C:
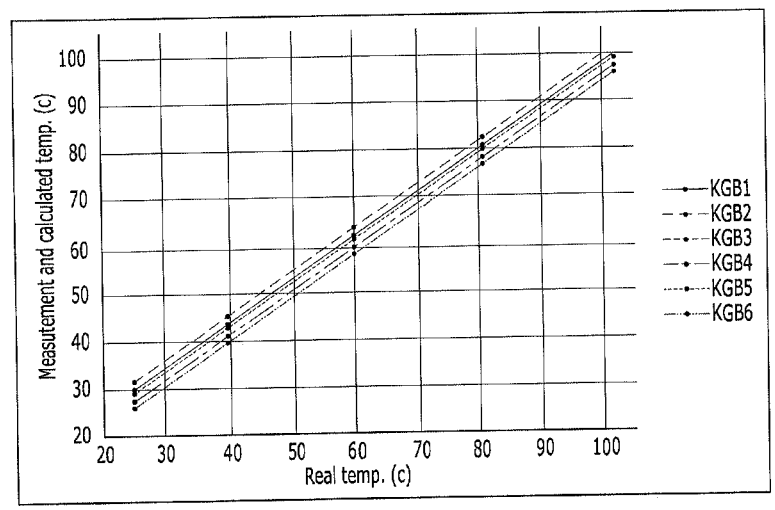
Figure 10D:
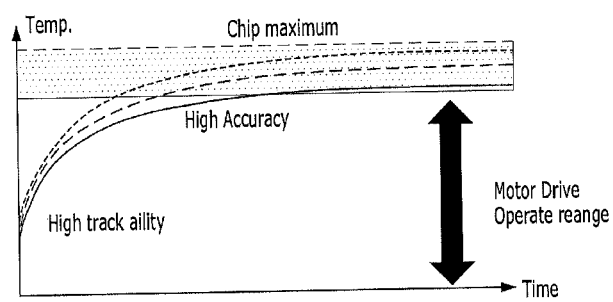

If the correction circuit is used as shown in FIG. 10B, a variation (or deviation) among the respective samples can be minimized.

For example, if the actual temperature is set to 40° C., the IGBT2 may sense and detect the sensing temperature value of about 36° C. If the actual temperature is set to 40° C., the IGBT6 may sense and detect the sensing temperature value of about 42° C.

If a low variation (or low deviation) among the respective samples occurs, the margin is minimized, such that the motor drive operating region may be increased in size.

As is apparent from the above description, the IGBT temperature sensor correction apparatus and the temperature sensing correction method using the same according to the embodiments of the present disclosure may have the following effects.

First, the embodiments of the present disclosure can correct an offset indicating a variation (i.e., deviation) for each temperature sensing sample according to the semiconductor process variation, resulting in implementation of correct temperature detection.

Second, overheating of the power module can be stably prevented, such that thermal destruction of the power module can also be prevented, resulting in guarantee of driver safety.

Third, the maximum output current range of an inverter needed to drive the motor is extended by minimizing the design margin, resulting in an increase of the maximum output range of the motor.

Fourth, temperature correction is achieved using an external circuit having a very simple structure according to the pattern formed in the semiconductor chip.

The method according to the embodiments of the present disclosure may be manufactured as a program that can be executed by a computer and may be stored in recording media readable by the computer. Examples of the recording media readable by the computer may include a read only memory (ROM), a random access memory (RAM), a compact disc read only memory (CD-ROM), a magnetic tape, a floppy disk, and an optical data storage device. The recording media readable by the computer may be distributed to computer systems connected to each other through a network such that code readable by the computer is stored or executed in a distributed manner. In addition, a functional program, code, and code segments for embodying the above method may be easily reasoned by programmers in the art to which the disclosure pertains.

It will be apparent to those skilled in the art that various modifications and variations can be made in the present disclosure without departing from the spirit or scope of the disclosure. Therefore, the above-mentioned detailed description must be considered only for illustrative purposes instead of restrictive purposes. The scope of the present disclosure must be decided by a rational analysis of the claims, and all modifications within equivalent ranges of the present disclosure are within the scope of the present disclosure.

What is claimed is:

1. An Insulated Gate Bipolar Transistor temperature sensor correction apparatus comprising:
    a driver Integrated Circuit (IC) comprising a first output terminal outputting a gate signal and a second output terminal outputting a constant voltage source;
    an Insulated Gate Bipolar Transistor (IGBT) comprising an IGBT receiving the gate signal, an internal resistor, and a sensing diode connecting a first end of the internal resistor; and
    an external resistor connecting the second output terminal and a second end of the internal resistor,
    wherein the driver IC is configured to sense a sensing voltage between a first end of the sensing diode and a second end of the sensing diode and obtain a temperature information based on the sensing voltage,
    wherein the driver IC is configured to obtain a current applied to the sensing diode based on a resistance of the external resistor, a resistance of the internal resistor and the temperature information,
    wherein the driver IC is configured to obtain an offset voltage value based on the sensing voltage and a predetermined voltage, and
    wherein the resistance of the external resistor is controlled based on the offset voltage value.

2. The IGBT temperature sensor correction apparatus according to claim 1, wherein the internal resistor includes a resistor pattern formed of low-doped silicon.

3. The IGBT temperature sensor correction apparatus according to claim 2, wherein the internal resistor is formed by a photolithography process using a same mask as used for the sensing diode.

4. The IGBT temperature sensor correction apparatus according to claim 2, wherein the internal resistor includes:
    a first horizontal resistor line spaced apart from a gate pad by a predetermined distance, and arranged in a horizontal direction;
    a first vertical resistor line arranged perpendicular to one end of the first horizontal resistor line;
    a second horizontal resistor line arranged horizontal to one end of the first vertical resistor line, and spaced apart from the first horizontal resistor line by a predetermined distance;
    a second vertical resistor line arranged perpendicular to one end of the second horizontal resistor line, and spaced apart from the first vertical resistor line by a predetermined distance; and
    a third horizontal resistor line arranged horizontal to one end of the second vertical resistor line, and spaced apart from the second horizontal resistor line by a predetermined distance.

5. The IGBT temperature sensor correction apparatus according to claim 4, wherein a value of the internal resistor line indicates a degree of process variation of the sensing diode.

6. The IGBT temperature sensor correction apparatus according to claim 1, wherein:
    when the sensing voltage is lower than the predetermined voltage, the offset voltage correction increasing the sensing voltage by increasing the current value allocated to the sensing diode.

7. The IGBT temperature sensor correction apparatus according to claim 1, wherein:
    when the sensing voltage is higher than the predetermined voltage, the offset voltage correction reducing the sensing voltage by reducing the current value allocated to the sensing diode.

8. A temperature sensing correction method using an Insulated Gate Bipolar Transistor (IGBT) temperature sensor, the method comprising:
    outputting, by a driver integrated circuit, a gate signal and a constant voltage source;
    sensing a sensing voltage between a first end of the sensing diode and a second end sensing diode and obtain a temperature information based on the sensing voltage;
    obtaining a current applied to the sensing diode based on a resistance of an external resistor, a resistance of the internal resistor and the temperature information;
    obtaining an offset voltage value based on the sensing voltage and a predetermined voltage; and
    controlling a resistance of the external resistor based on the offset voltage value.

9. The method according to claim 8, wherein the internal resistor includes a resistor pattern formed of low-doped silicon.

10. The method according to claim 8, wherein the internal resistor is formed by a photolithography process using a same mask as used for the sensing diode.

11. The method according to claim 8, wherein the internal resistor includes:
    a first horizontal resistor line spaced apart from a gate pad by a predetermined distance, and arranged in a horizontal direction;
    a first vertical resistor line arranged perpendicular to one end of the first horizontal resistor line;
    a second horizontal resistor line arranged horizontal to one end of the first vertical resistor line, and spaced apart from the first horizontal resistor line by a predetermined distance;
    a second vertical resistor line arranged perpendicular to one end of the second horizontal resistor line, and spaced apart from the first vertical resistor line by a predetermined distance; and a third horizontal resistor line arranged horizontal to one end of the second vertical resistor line, and spaced apart from the second horizontal resistor line by a predetermined distance.

12. The method according to claim 8, wherein the change of the current value comprises:
when the sensing voltage is lower than the predetermined voltage, performing, by the driver IC, offset voltage correction to increase the sensing voltage by increasing the current value allocated to the sensing diode.

13. The method according to claim 8, wherein the change of the current value comprises:
when the sensing voltage is higher than the predetermined voltage, performing, the driver IC, offset voltage correction to reduce the sensing voltage by reducing the current value allocated to the sensing diode.

14. A non-transitory computer readable medium containing program instructions for performing a temperature sensing correction method using an Insulated Gate Bipolar Transistor (IGBT) temperature sensor, the program instructions when executed by a processor causing the processor to:
output a gate signal and a constant voltage source;
sense a sensing voltage between one end of the sensing diode and the other end sensing diode and obtain a temperature information based on the sensing voltage,
obtain a current applied to the sensing diode based on a resistance of an external resistor, a resistance of the internal resistor and the temperature information,
obtain an offset voltage value based on the sensing voltage and a predetermined voltage; and
control a resistance of the external resistor based on the offset voltage value.

* * * * *